US006684234B1

(12) United States Patent  (10) Patent No.: US 6,684,234 B1
Kraker  (45) Date of Patent: Jan. 27, 2004

(54) METHOD FOR FILTERING A DIGITAL SIGNAL SEQUENCE

(75) Inventor: Alfred Kraker, Vienna (AT)

(73) Assignee: Siemens Aktiengesellschaft, Münich (DE)

( * ) Notice: Subject to any disclaimer, the term of this patent is extended or adjusted under 35 U.S.C. 154(b) by 503 days.

(21) Appl. No.: 09/710,412

(22) Filed: Nov. 9, 2000

(30) Foreign Application Priority Data

Nov. 10, 1999 (DE) .......................................... 199 54 088

(51) Int. Cl.[7] .............................................. G06F 17/10
(52) U.S. Cl. ...................................................... 708/322
(58) Field of Search .................................. 708/322, 323

(56) References Cited

U.S. PATENT DOCUMENTS

| | | | | |
|---|---|---|---|---|
| 5,000,183 A | * | 3/1991 | Bonnefous | 600/437 |
| 5,657,349 A | | 8/1997 | Sugiyama | 375/232 |
| 5,721,694 A | * | 2/1998 | Graupe | 702/191 |
| 5,768,392 A | * | 6/1998 | Graupe | 381/94.3 |
| 6,549,804 B1 | * | 4/2003 | Osorio et al. | 600/544 |

OTHER PUBLICATIONS

"A Wavelet Tour of Signal Processing," Mallat, , Academic Press, 1998, pp. 254–259.
"Wavelet Basics," Chan, Kluwer Academic Publishers, 1995, 3.1–3.4.
"Orthonormal Bases of Compactly Supported Wavelets," Daubechies, Comm. in Pure and Applied Math., vol. 41, No. 7 (1998), pp. 167–213.

* cited by examiner

*Primary Examiner*—David H. Malzahn
(74) *Attorney, Agent, or Firm*—Schiff Hardin & Waite

(57) ABSTRACT

A method for filtering a digital signal sequence with adaptive filters given assistance of discrete parameter wavelet transformation is recited that, among other things, can be utilized in telecommunication technology for echo compensation. The method has especially small filter lengths, and thus low calculating outlay, for determining the optimum coefficient set for the filters employed.

6 Claims, 5 Drawing Sheets

METHOD FOR FILTERING A DIGITAL SIGNAL SEQUENCE

BACKGROUND OF THE INVENTION

1. Field of the Invention

The present invention is directed to a method wherein an output signal sequence is formed from a digital input signal sequence and a reference sequence with adaptive filters, with a filter output signal that is as optimally matched to the respective filter reference signal being formed from a respective filter input signal and a filter reference signal.

2. Description of the Prior Art

Methods of the above type are utilized, for example, in telecommunication technology for echo compensation that is necessary given comparatively great distances to be bridged between two telecommunication terminal devices. The input signal arriving at the reception equipment is supplied both to the circuit known as a "hybrid" that feeds the arriving signal into the local loop of the reception equipment and the outgoing signal into the line, as well as to the input of an adaptive filter in the reception equipment. The output signal of the adaptive filter is subtracted from the outgoing signal fed into the line—in this case, the reference signal at the same time—, and the remaining difference, i.e. the error signal, is used for the adaptation of the coefficient of the adaptive filter.

As is known the prior art, a single finite input response filter, abbreviated as FIR filter, having a number of coefficients, adapted to the signal delay that occurs, is utilized for this purpose. Given a sampling rate of kHz, a few hundred coefficients are required, with the equation known as the "Least Squares Wiener-Hopf" equation supplying the optimum coefficient set for such a filter. Since standard signal processors, however, have limited computing capability, only the gradient method is applied instead of the mathematically optimum "Least Squares Wiener-Hopf" equation, since the gradient method requires less calculating outlay. This method, however, requires long training times and is not suitable for supplying an optimum result for each input value.

As a result of taking the current signal delay into consideration, further, the filters defined thereby exhibit significantly more coefficients than would be necessary for the approximation of the magnitude frequency response, i.e. they are over-defined and therefore tend to unstable behavior.

U.S. Pat. No. 5,657,349 ("Method and Apparatus Capable of Quickly Identifying an Unknown System With A Final Error Reduced") discloses that an unknown system can be identified with K adaptive filters, whereby K is a whole number greater than 1. An input signal is thereby applied to the unknown system, this input signal being subdivided into K sub-band signals using an analysis filter bank. Each of these K sub-band signals is subsequently under-sampled and applied to one of the K adaptive filters as filter input signal. Just like the input signal, the output signal of the unknown system is subdivided into K sub-band systems, each of these K sub-band signals is under-sampled and applied as filter reference signal to respectively one of the K adaptive filters. Each of the K adaptive filters calculates the difference between the filter reference signal and the filter input signal and emits this as the filter output signal, this being utilized for the adaptation of the filter coefficient. The filter output signals are subsequently over-sampled and combined to form an output signal using a synthesis filter bank.

If a pseudocode is then employed for the input signal and a payload signal affected with an echo is provided as output signal of the unknown system, then an echo-suppressed payload signal is present at the output of the synthesis filter bank. The extent of the echo suppression is essentially dependent on the coefficients of the adaptive filters.

The quality of the output signal, however, is also dependent on the division of the overall frequency spectrum into sub-bands, with a finer subdivision supplying a qualitatively better signal. Since the sub-division is made in frequency bands of equal width, a relatively slight quality improvement is achieved at the expense of a technically and computationally large outlay.

SUMMARY OF THE INVENTION

An object of the present invention is to provide a method for filtering a digital filter sequence wherein the filtering ensues with comparatively little technical and computational outlay.

This object is inventively achieved in a method wherein time functions are formed from the digital input signal sequence and the digital reference sequence with scaling functions, respective component sets are determined from the time functions using discrete parameter wavelet transformation, applied in pairs to adaptive filters as a filter input and a filter reference signal, and wherein the filter output signals of the adaptive filters are combined to form a single output signal sequence using an operation inverse to the originally applied discrete parameter wavelet transformation.

In contrast to the conventional methods, in the inventive method contradictory demands need not be met for the approximation of the magnitude of frequency response and for taking the signal delay into consideration. This is distinguished by especially small filter lengths—i.e., by few coefficients—and, thus, substantially less computational outlay for determining the optimum coefficient set for the filters employed.

The division of the frequency spectrum of the input signal in the inventive method, moreover, ensues in logarithmic scale with respect to the center frequency of the individual frequency bands. The employment of wavelets advantageously offers a uniform quality for the individual frequency bands. An increase in the quality of the output signal sequence therefore can ensue with comparatively little technical and computational outlay.

In an embodiment of the inventive method the output signal sequence $\epsilon(n-p)$ is reconstructed instead of the output signal sequence $y(n-p)$, namely from the error sequences $d_n^1(e), d_n^2(e), \ldots, d_n^L(e)$ and $c_n^L(e)$. This method, for example, is utilized for the application known as "interference canceling". A noise-infested payload signal is thereby supplied to the adaptive filters the as filter reference signal and a noise correlated thereto is supplied as the filter input signal. Since the adaptive filters are designed for adapting the filter output signal to the filter reference signal, the noise is present as the filter output signal and the nearly noise-compensated payload signal is present as the error signal.

In an embodiment of the inventive method the factors $d_n^1(x), d_n^2(x), \ldots, d_n^L(x)$ and $c_n^L(x)$, or, respectively, $d_n^1(r), d_n^2(r), \ldots, d_n^L(r)$ and $c_n^L(r)$ of the discrete parameters of wavelet transformation are determined according to the Mallat algorithm for multi-resolution analysis, and the output signal sequence $y(n-p)$ or $\epsilon(n-p)$ is reconstructed with the inverse operation, the Mallat algorithm for the multi-stage synthesis, being reconstructed from the factors $d_n^1(y)$, $d_n^2(y), \ldots, d_n^L(y)$ and $c_n^L(y)$. The Mallat algorithm for the multi-resolution analysis, which is disclosed in Mallat, S. G., A Theory For Multi resolution Signal Decomp.: The Wavelet Representation; IEEE Trans. Pattern Analysis, Machine Intelligence, Vol. 11, No. 7, pp. 674–693, July 1989, makes the method of making discrete parameter wavelet transformation, abbreviated as DPWT, available for practical application with digital signal processors and comparatively little technological outlay. Modules are needed for this purpose that are composed of a finite impulse response low-pass filtering (FIR low-pass filter) and immediately successively ensuing under-sampling by the factor of two, and modules that are composed of a finite impulse response high-pass filtering (FIR high-pass filtering) and immediately successively ensuing under-sampling by the factor of two. The Mallat algorithm for multi-stage synthesis that is described in Chan, Y. T., Wavelet Basics, Kluwer Academic Publishing Group 1995, requires modules that are composed of an over-sampling by the factor of two and immediately subsequently ensuing FIR low-pass filtering and modules that are composed of an over-sampling by the factor of two and immediately successively ensuing FIR high-pass filtering. The absolute values of the coefficients of all low-pass and high-pass filters employed are identical. Differences in the sequencing and the operational sign of the respective absolute values of the coefficient sets merely occur between the different types of filter, so that a common coefficient set can be employed for all filters, and, thus a memory location can be saved.

Due to the recursive under-sampling by the factor of two, a comparatively high, possible signal delay can occur and above this between the individual stages, even given a filter length that is adapted to the approximation of the amount frequency response. It is especially advantageous that the number of required calculating steps, which is calculated as $$n = n_0 + \frac{n_0}{2} + \frac{n_0}{4} + \ldots = 2 \cdot n_0$$

where $n_0$ references the number of calculating steps in the first stage, is significantly lower compared to a single, long FIR filter. The recited equation is valid under the precondition that all filters have the same length which is not necessary for the inventive method.

It is also beneficial when the coefficients of the FIR filters $g(l), h(l), \bar{g}(l), \bar{h}(l)$ $l=0,1,\ldots,p-1$ utilized in the framework of the Mallat algorithm for the multi-resolution analysis and the multi-stage synthesis agree with the values defined by I. Daubechies, whereby p-1 indicates the filter order. This class of wavelets, which is known from Daubechies, I, Orthonormal Basis of Compactly Supported Wavelets, Comm. In Pure and Applied Math, Vol. 41, No. 7, pp. 909–996, 1988, offers good resolution in the time domain as well as in the frequency domain. The wavelets, moreover, are temporally exact and are limited in the frequency domain by a rapidly dropping spectrum at low and high frequencies.

In a further embodiment of the invention the least mean square algorithm is employed for the operation of the adaptive filters. This algorithm supplies the optimum coefficient set for a FIR filter.

DESCRIPTION OF THE PREFERRED EMBODIMENTS

The invention is explained in detail on the basis of an exemplary embodiment shown in the figures, relating to an exemplary method for adaptive filtering that, among other things, can be utilized for echo compensation in the field of telecommunication technology, particularly when the error signal $\epsilon(n-p)$ is reconstructed instead of the output signal $y(n-p)$.

Figure 1:
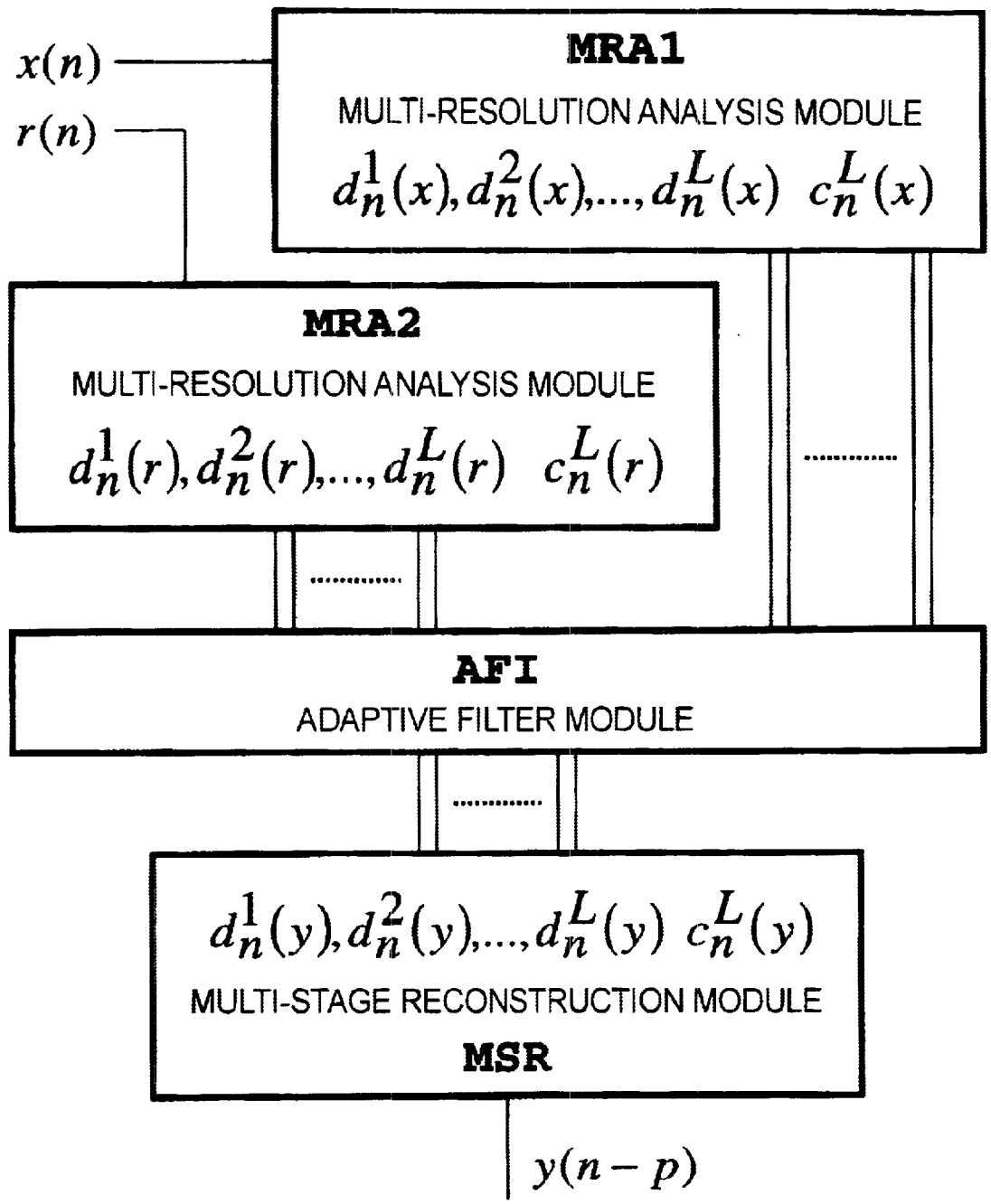
FIG. 1 shows the basic structure of the inventive method.

FIG. 1 shows a digital input signal sequence x(n) that represents an analog signal sampled with the sampling frequency of 8 kHz. The components $d_n^1(x), d_n^2(x), \ldots, d_n^L(x)$~and~$c_n^L(x)$ of the discrete parameter wavelet transformation are determined from this with the assistance of a first multi-resolution analysis module MRA1 that enables the implementation of the Mallat algorithm for the multi-resolution analysis. Analogous thereto, the components $d_n^1(r), d_n^2(r), \ldots, d_n^L(r)$~and~$c_n^L(r)$ are calculated from a reference sequence r(n) with the assistance of a second multi-resolution analysis module MAR2. The components $d_n^1(x), d_n^2(x), \ldots, d_n^L(x)$~and~$c_n^L(x)$ thereby serve as filter input signals and the components $d_n^1(r), d_n^2(r), \ldots, d_n^L(r)$~and~$c_n^L(r)$ serve as filter reference signals for an adaptive filter module AFI with which the adaptive filtering is undertaken. The filter output signals $d_n^0(y), d_n^1(y), \ldots, d_n^L(y)$~and~$c_n^L(y)$ are subjected to the inverse discrete parameter wavelet transformation with the multi-stage reconstruction module MSR that enables the implementation of the Mallet algorithm for the multi-stage synthesis, this supplying the output signal sequence y(n-p) as result.

Figure 2:
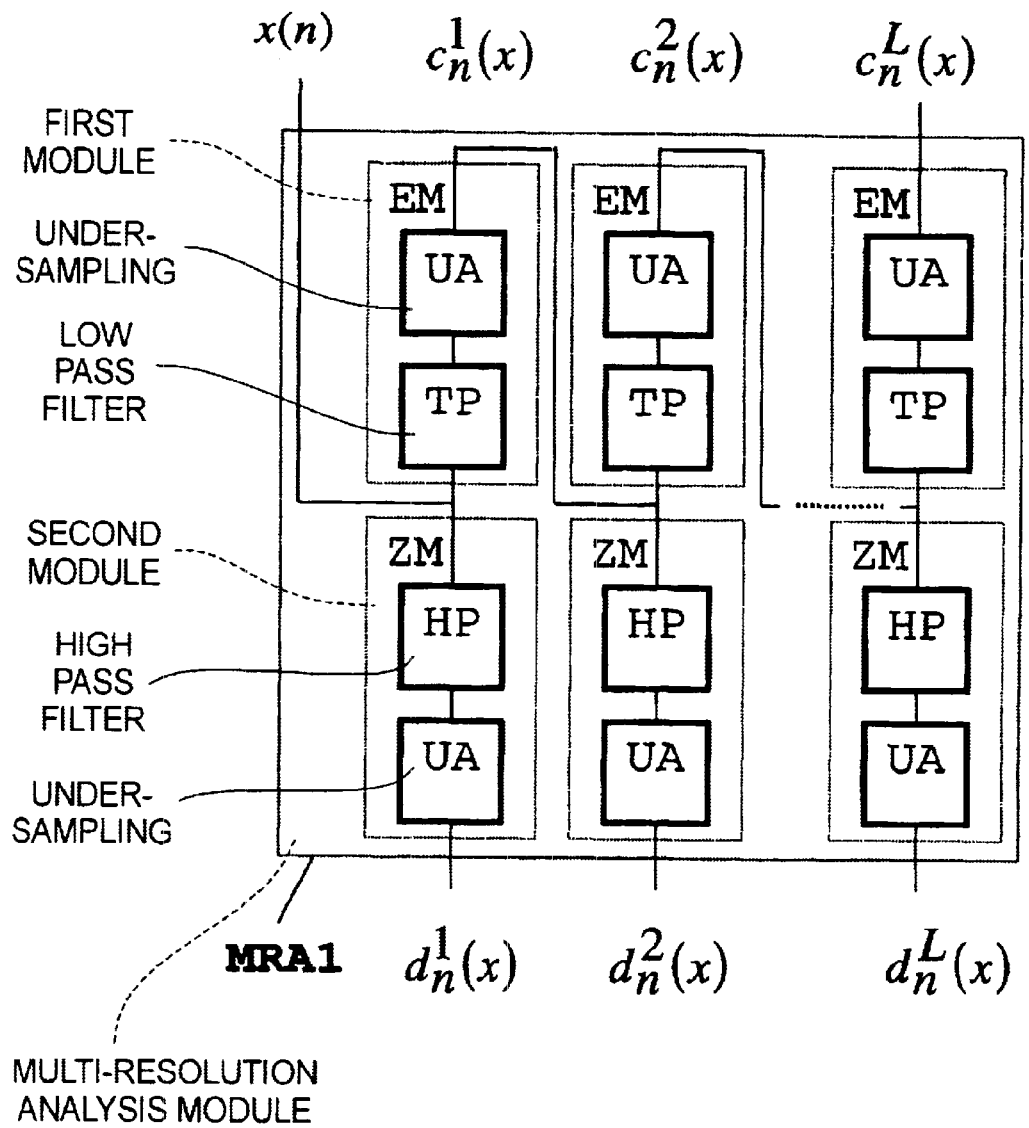
FIG. 2 shows the splitting of the input signal x(n) into the components of the discrete parameter wavelet transformation in the inventive method.

As can be seen from FIG. 2 the input signal sequence x(n) is recursively split into the output signals $c_n^1(x), c_n^2(x), \ldots, c_n^L(x)$ with a plurality of first modules EM that are identical and connected following one another in the signal course.

FIR low-pass filtering ensues in every first module EM, followed an under-sampling UA by the factor of two. In this under-sampling, every second numerical value of the signal sequence is deleted and the numerical sequence is newly indexed. The sampling frequency that thereby arises is therefore lower than would be prescribed for x(n) by Shannon's sampling theorem. The coefficients of the FIR low-pass filters thereby correspond to $\sqrt{2} \cdot \bar{g}(l)$ $l==0,1,\ldots,p-1$.

The components of the discrete parameter wavelet transformation $d_n^1(x), d_n^2(x), \ldots, d_n^L(x)$ are formed from the input signal sequence x(n) and the output signals $c_n^1(x), c_n^2(x), \ldots, c_n^L(x)$ with a number of identical second modules ZM—wherein FIR high-pass filtering ensues with coefficients corresponding to $\sqrt{2} \cdot \bar{h}(l)$ $l=0,1,\ldots,p-1$ and, subsequently, an under-sampling UA ensues by the factor of two.

All of first and second modules are combined to form a first multi-resolution analysis module MRA1, whereby x(n) represents an input signal and $d_n^1(x), d_n^2(x), \ldots, d_n^L(x)$ and $c_n^L(x)$ represent output signals.

The advantage of the inventive method is then comprised therein that the sampling frequency of the signal sequence of the components $d_n^1(x), d_n^2(x), \ldots, d_n^L(x)$ comprises only $\frac{1}{2}^1$, $\frac{1}{2}^2, \ldots, \frac{1}{2}^L$ of the value of the sampling frequency of the input signal sequence, and thus the calculating outlay—with respect to a sampling interval of the input signal—is correspondingly reduced compared to known methods. The components $c_n^1(x), c_n^2(x), \ldots, c_n^{L-1}(x)$ merely represent intermediate results and are not further-processed.

Figure 3:
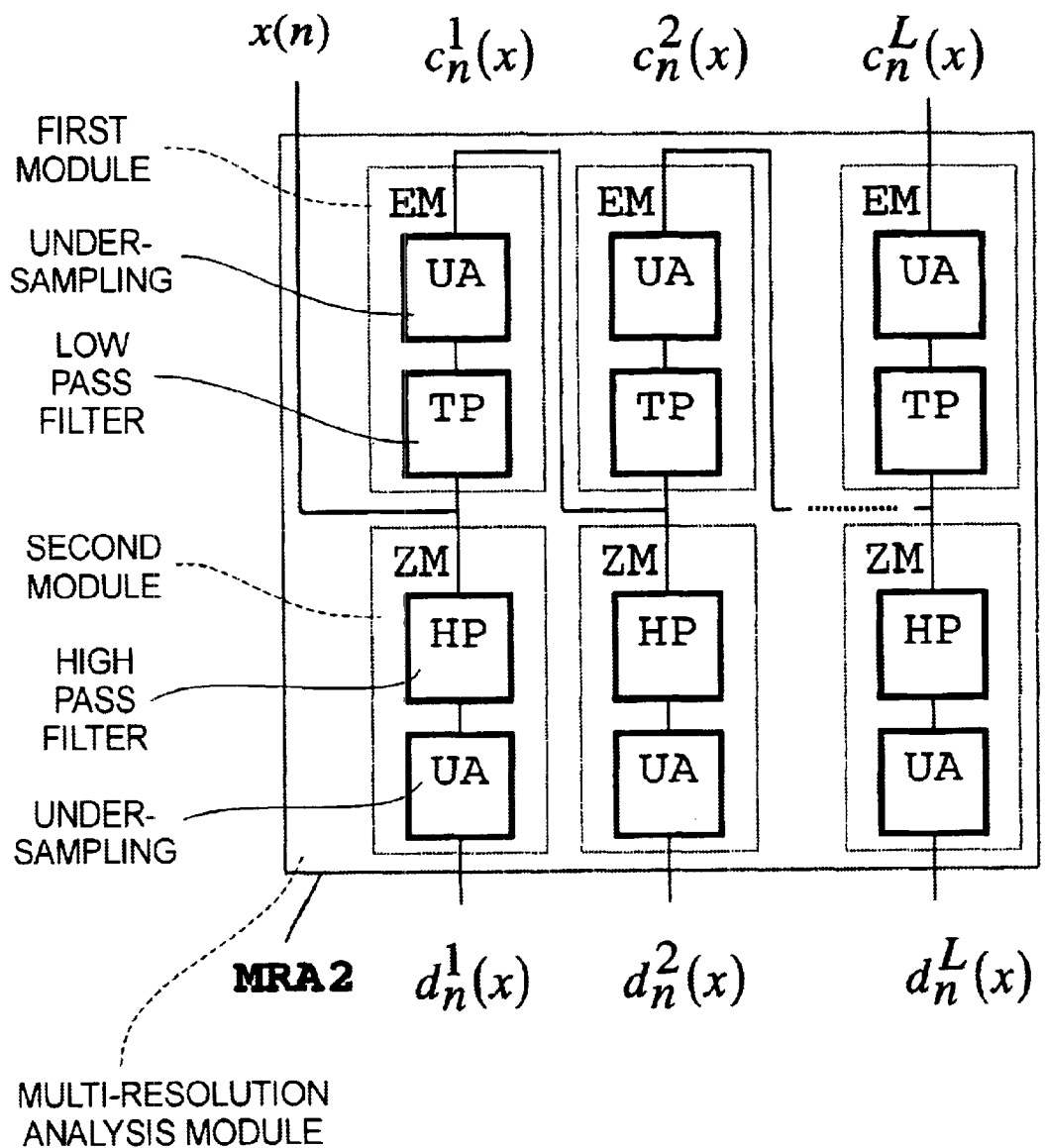
FIG. 3 shows the splitting of the reference sequence r(n) analogous to FIG. 2 in the inventive method.

Analogous to FIG. 2, FIG. 3 shows the processing of the reference sequence r(n). All first and second modules EM and ZM are thereby combined to form a second multi-resolution analysis module MRA2, whereby r(n) represents an input signal, and $d_n^1(r), d_n^2(r), \ldots, d_n^L(r)$ and $c_n^L(r)$ represent output signals.

Figure 4:
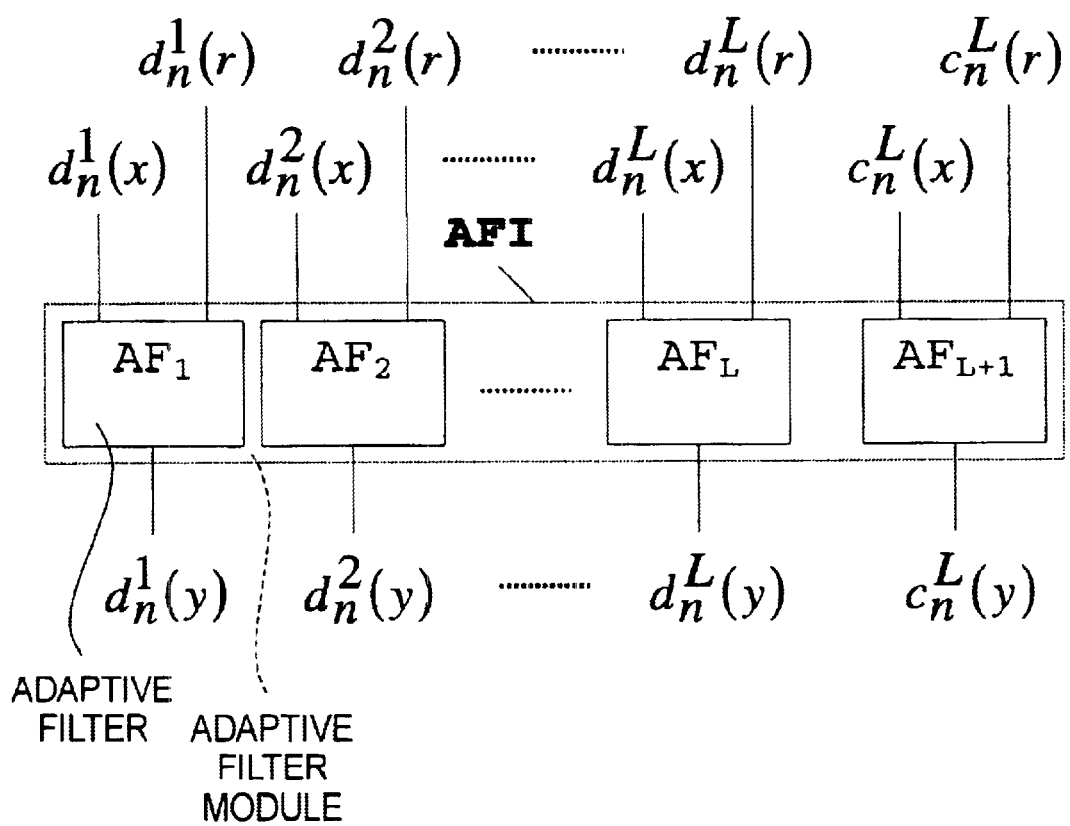
FIG. 4 shows the adaptive filtering of the parts of the discrete parameter wavelet transformation in the inventive method.

It can be seen from FIG. 4 that the parts $d_n^1(x), d_n^2(x), \ldots, d_n^L(x)$ and $c_n^L(x)$, or $d_n^1(r), d_n^2(r), \ldots, d_n^L(r)$ and $c_n^L(r)$ of the discrete parameter wavelet transformation respectively form, in pairs, a filter input and a filter reference signal adaptive filter $AF_1$ through $AF_{L+1}$. The components $d_n^1(y), d_n^2(y), \ldots, d_n^L(y)$ and $c_n^L(y)$ represent the filter output signals of the adaptive filters $AF_1$ through $AF_{L+1}$, whereby the latter are combined to form an adaptive filter module AFI.

Figure 5:
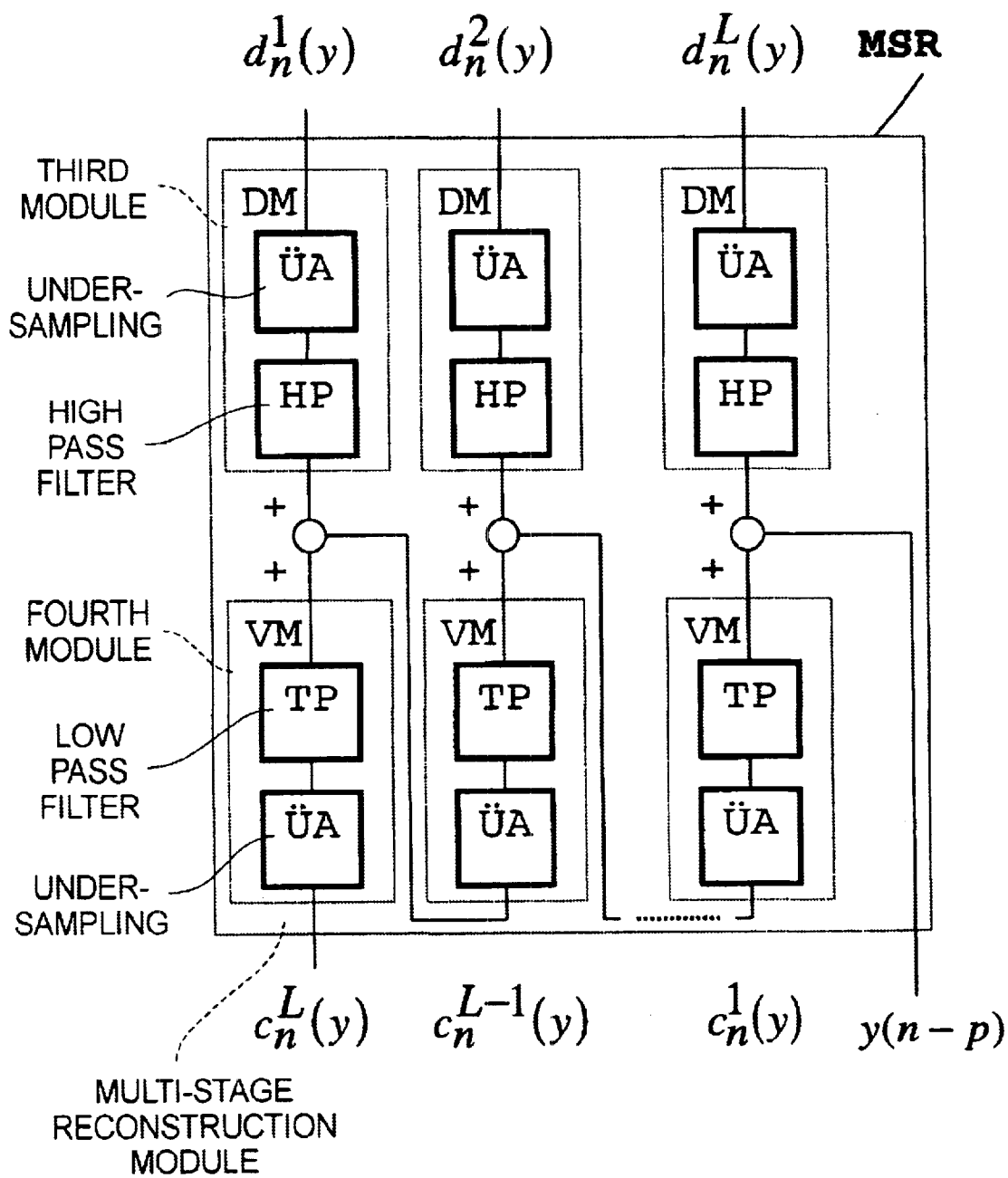
FIG. 5 shows the inverse discrete parameter wavelet transformation, applied to the components $d_n^0(y), d_n^1(y), \ldots, d_n^L(y)$~and~$c_n^L(y)$ in the inventive method.

FIG. 5 shows that the components $d_n^1(y), d_n^2(y), \ldots, d_n^L(y)$ respectively form an input signal of a respective third module DM wherein an over-sampling ÜA by the factor of two, followed by FIR high-pass filtering, ensue. In this over-sampling, the value zero is inserted between every second numerical value of the signal sequence and the numerical sequence is newly indexed. The sampling frequency at the output of the third module that thereby arises is therefore twice as high as the sampling frequency at the input of the module. The coefficients of the FIR high-pass filter thereby correspond to $\sqrt{2} \cdot \overline{h}(l)(l)=0,1,\ldots,p-1$.

The parts $c_n^L(y), c_n^{L-1}(y), \ldots c_n^1(y)$, analogous thereto, are the input signals of a number of identical fourth modules VM wherein an over-sampling ÜA by the factor of two followed by FIR low-pass filtering with coefficients corresponding to $\sqrt{2} \cdot \overline{g}(l)$ ensue.

The output signals of the third and fourth modules DM and VM are summed up in pairs in the following way: the sum of the output signal of the third module DM with the input signal $d_n^1(y)$ and of the output signal of the fourth module VM with the input signal $c_n^L(y)$ simultaneously forms the part $c_n^{L-1}(y)$. This rule is recursively applied until the component $c_n^0(y)$ is reached, this being identical to the output signal sequence y(n–p).

All third and fourth modules are combined to form a multi-stage reconstruction module MSR, whereby $d_n^1(y), d_n^2(y), \ldots, d_n^L(y)$ and $c_n^L(y)$ represent input signals and y(n–p) represents an output signal.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for forming an output signal sequence y(n–p) from a digital input signal sequence x(n) and a reference sequence r(n) with adaptive filters, whereby a respective filter output signal that is optimally adapted to the respective filter reference signal is formed with the adaptive filters from a respective filter input signal and a respective filter output signal, comprising the steps of:

forming the time functions $$x^0(t) = \sum_n x(n) \cdot \phi(t-n) \text{ and } r^0(t) = \sum_n r(n) \cdot \phi(t-n)$$

from the digital input signal sequence x(n) and the digital reference sequence r(n) with scaling functions $$\phi(t) = 2 \cdot \sum_{l=0}^{n-1} g(l) \cdot \phi(2 \cdot t - l);$$

determining respective component sets $d_n^1(x), d_n^2(x), \ldots, d_n^L(x)$ and $c_n^L(x)$ and $d_n^1(r), d_n^2(r), \ldots, d_n^L(r)$ and, $c_n^L(r)$ of the discrete parameter wavelet transformation from said time functions with wavelet $$\varphi(t) = 2 \cdot \sum_{l=0}^{p-1} h(l) \cdot \phi(2 \cdot t - l),$$

these being respectively applied in pairs to L+1 adaptive filters as a filter input and as a filter reference signal; and combining the filter output signals of the adaptive filters $d_n^1(y), d_n^2(y), \ldots, d_n^L(y)$ and $c_n^L(y)$ to form a single output signal sequence y(n–p), with an operation inverse to the originally applied discrete parameter wavelet transformation, wherein:

$d_n^m(x) = DPWT(x,m,n)$
$d_n^m(r) = DPWT(r,m,n)$
$h(l) = (-1)^l \cdot g(p-1-l)$
$\overline{g}(l) = g(p-1-l)$
$\overline{h}(l) = (-1)^{l-1} \cdot g(l)$
$\overline{h}(l) = h(p-1-l)$ $$\sum_{l=0}^{p-1} g^2(l) = \sum_{l=0}^{p-1} h^2(l) = \frac{1}{2}, \text{ and}$$

$$\sum_{l=0}^{p-1} g(l) \cdot g(l+2 \cdot k) = \sum_{l=0}^{p-1} h(l) \cdot h(l+2 \cdot k) = 0 \begin{vmatrix} \text{for } k = 1, 2, \ldots, p-1 \\ \frac{1}{2} \text{ for } k = 0. \end{vmatrix}$$

2. Method according to claim 1, comprising respectively determining the component sets $d_n^1(x), d_n^2(x), \ldots, d_n^L(x)$ and $c_n^L(x)$ and $d_n^1(r), d_n^2(r), \ldots d_n^L(r)$ and $c_n^L(r)$ of the discrete parameter wavelet transformation according to the Mallat algorithm for multi-resolution analysis and the output signal sequence y(n–p) from the components $d_n^1(y), d_n^2(y), \ldots, d_n^L(y)$ and $c_n^L(y)$ with the operation inverse thereto, the Mallat algorithm for multi-stage synthesis.

3. A method according to claim 1 comprising, using the least mean square algorithm for operation of the adaptive filters.

4. A method for forming an output signal sequence ∈(n–p) from a digital input signal sequence x(n) and a reference sequence r(n) with adaptive filters, whereby a respective filter output signal that is optimally adapted to the respective filter reference signal is formed with the adaptive filters from a respective filter input signal and a respective filter output signal, comprising the steps of:

forming the time functions $$x^0(t) = \sum_n x(n) \cdot \phi(t-n) \text{ and } r^0(t) = \sum_n r(n) \cdot \phi(t-n)$$

are formed from the digital input signal sequence x(n) and the digital reference sequence r(n) with scaling functions $$\varphi(t) = 2 \cdot \sum_{l=0}^{p-1} g(l) \cdot \phi(2 \cdot t - l);$$

determining respect component sets $d_n^1(x), d_n^2(x), \ldots, d_n^L(x)$ and $c_n^L(x)$, and $d_n^1(r), d_n^2(r), \ldots d_n^L(r)$ and $c_n^L(r)$ of the discrete parameter wavelet transformation from the time functions with wavelet $$\varphi(t) = 2 \cdot \sum_{l=0}^{p-1} g(l) \cdot \phi(2 \cdot t - l),$$

these being respectively applied in pairs to L+1 adaptive filters as a filter input and as a filter reference signal;

calculating differences $d_n^m(\epsilon) = d_n^m(r) - d_n^m(y)$ and $c_n^L(e) = c_n^L(r) - c_n^L(y)$ in pairs from the filter output signals of the adaptive filters $d_n^1(y), d_n^2(y), \ldots, d_n^L(y)$ and $c_n^L(y)$ and the components $d_n^1(r), d_n^2(r), \ldots d_n^L(r)$ and $c_n^L(r)$; and combining the components of the error sequence $d_n^1(\epsilon), d_n^2(\epsilon), \ldots, d_n^L(\epsilon)$ and $c_n^L(\epsilon)$ resulting therefrom are to form a single output signal sequence $\epsilon(n-p)$, with an operation inverse to the originally applied discrete parameter wavelet transformation, wherein $d_n^m(x) = DPWT(x,m,n)$
$d_n^m(r) = DPWT(r,m,n)$
$h(l) = (-1)^l \cdot g(p-1-l)$
$\overline{g}(l) = g(p-1-l)$
$\overline{h}(l) = (-1)^{l-1} \cdot g(l)$
$\overline{h}(l) = h(p-1-l)$ $$\sum_{l=0}^{p-1} g^2(l) = \sum_{l=0}^{p-1} h^2(l) = \frac{1}{2}, \text{ and}$$

$$\sum_{l=0}^{p-1} g(l) \cdot g(l+2 \cdot k) = \sum_{l=0}^{p-1} h(l) \cdot h(l+2 \cdot k) = 0 \begin{vmatrix} \text{for } k = 1, 2, \ldots, p-1 \\ \frac{1}{2} \text{ for } k = 0. \end{vmatrix}$$

5. A method according to claim 4, comprising determining the component sets $d_n^1(x), d_n^2(x), \ldots, d_n^L(x)$ and $c_n^L(x)$ and, $d_n^1(r), d_n^2(r), \ldots d_n^L(r)$ and $c_n^L(r)$, of the discrete parameter wavelet transformation are determined according to the Mallat algorithm for multi-resolution analysis and the output signal sequence $\epsilon(n-p)$ from the components $d_n^1(e), d_n^2(e), \ldots, d_n^L(e)$ and $c_n^L(e)$ with the operation inverse thereto, the Mallat algorithm for multi-stage synthesis.

6. A method according to claim 4 comprising, using the least mean square algorithm for operation of the adaptive filters.

* * * * *